United States Patent
Kim

(10) Patent No.: US 7,802,064 B2
(45) Date of Patent: Sep. 21, 2010

(54) FLASH MEMORY SYSTEM CONTROL SCHEME

(75) Inventor: Jin-Ki Kim, Ottawa (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 628 days.

(21) Appl. No.: 11/693,027

(22) Filed: Mar. 29, 2007

(65) Prior Publication Data

US 2007/0233939 A1    Oct. 4, 2007

Related U.S. Application Data

(60) Provisional application No. 60/788,083, filed on Mar. 31, 2006.

(51) Int. Cl.
  *G06F 12/00* (2006.01)
  *G06F 13/00* (2006.01)
  *G06F 13/28* (2006.01)
(52) U.S. Cl. .................. 711/157; 711/103; 711/167
(58) Field of Classification Search ............. 711/103, 711/167, 157
  See application file for complete search history.

(56) References Cited

U.S. PATENT DOCUMENTS

| 4,174,536 A | 11/1979 | Misunas et al. |
| 4,733,376 A | 3/1988 | Ogawa |
| 4,796,231 A | 1/1989 | Pinkham |
| 5,126,808 A | 6/1992 | Montalvo et al. |
| 5,136,292 A | 8/1992 | Ishida |
| 5,175,819 A | 12/1992 | Le Ngoc et al. |
| 5,243,703 A | 9/1993 | Farmwald et al. |
| 5,280,539 A | 1/1994 | Yeom et al. |
| 5,365,484 A | 11/1994 | Cleveland et al. |

(Continued)

FOREIGN PATENT DOCUMENTS

| WO | WO 01/69411 A2 | 9/2001 |
| WO | 2005069150 A1 | 7/2005 |
| WO | WO 2005069150 A1 | 7/2005 |

OTHER PUBLICATIONS

"IEEE Definition of Data Structure", The Authoritative Dictionary of IEEE Standards Terms, Seventh Edition. Standards Information Network IEEE Press, 2000, p. 273.*

(Continued)

*Primary Examiner*—Stephen C Elmore
*Assistant Examiner*—Mark A Giardino, Jr.
(74) *Attorney, Agent, or Firm*—Shin Hung; Borden Ladner Gervais LLP

(57) ABSTRACT

A Flash memory system architecture having serially connected Flash memory devices to achieve high speed programming of data. High speed programming of data is achieved by interleaving pages of the data to be programmed amongst the memory devices in the system, such that different pages of data are stored in different memory devices. A memory controller issues program commands for each memory device. As each memory device receives a program command, it either begins a programming operation or passes the command to the next memory device. Therefore, the memory devices in the Flash system sequentially program pages of data one after the other, thereby minimizing delay in programming each page of data into the Flash memory system. The memory controller can execute a wear leveling algorithm to maximize the endurance of each memory device, or to optimize programming performance and endurance for data of any size.

6 Claims, 9 Drawing Sheets

U.S. PATENT DOCUMENTS

| | | |
|---|---|---|
| 5,404,460 A | 4/1995 | Thomsen et al. |
| 5,440,694 A | 8/1995 | Nakajima |
| 5,452,259 A | 9/1995 | McLaury |
| 5,473,563 A | 12/1995 | Suh et al. |
| 5,473,566 A | 12/1995 | Rao |
| 5,473,577 A | 12/1995 | Miyake et al. |
| 5,530,828 A * | 6/1996 | Kaki et al. ............... 711/103 |
| 5,596,724 A | 1/1997 | Mullins et al. |
| 5,602,780 A | 2/1997 | Diem et al. |
| 5,636,342 A | 6/1997 | Jeffries |
| 5,671,178 A | 9/1997 | Park et al. |
| 5,721,840 A | 2/1998 | Soga |
| 5,740,379 A | 4/1998 | Hartwig |
| 5,761,146 A | 6/1998 | Yoo et al. |
| 5,771,199 A | 6/1998 | Lee |
| 5,802,006 A | 9/1998 | Ohta |
| 5,818,785 A | 10/1998 | Ohshima |
| 5,828,899 A | 10/1998 | Richard et al. |
| 5,835,935 A | 11/1998 | Estakhri et al. |
| 5,859,809 A | 1/1999 | Kim |
| 5,872,994 A | 2/1999 | Akiyama et al. |
| 5,937,425 A | 8/1999 | Ban |
| 5,941,974 A | 8/1999 | Babin |
| 5,959,930 A | 9/1999 | Sakuria |
| 5,995,417 A | 11/1999 | Chen et al. |
| 6,002,638 A | 12/1999 | John |
| 6,085,290 A | 7/2000 | Smith et al. |
| 6,091,660 A | 7/2000 | Sasaki et al. |
| 6,107,658 A | 8/2000 | Itoh et al. |
| 6,144,576 A | 11/2000 | Leddige et al. |
| 6,148,364 A | 11/2000 | Srinivasan et al. |
| 6,178,135 B1 | 1/2001 | Kang |
| 6,304,921 B1 | 10/2001 | Rooke |
| 6,317,350 B1 | 11/2001 | Pereira et al. |
| 6,317,352 B1 | 11/2001 | Halbert et al. |
| 6,438,064 B2 | 8/2002 | Ooishi |
| 6,442,098 B1 | 8/2002 | Kengeri |
| 6,535,948 B1 | 3/2003 | Wheeler et al. |
| 6,584,303 B1 | 6/2003 | Kingswood et al. |
| 6,594,183 B1 | 7/2003 | Lofgren et al. |
| 6,601,199 B1 | 7/2003 | Fukuda et al. |
| 6,611,466 B2 | 8/2003 | Lee et al. |
| 6,658,582 B1 | 12/2003 | Han |
| 6,680,904 B1 | 1/2004 | Kaplan et al. |
| 6,715,044 B2 | 3/2004 | Lofgren et al. |
| 6,732,221 B2 | 5/2004 | Ban |
| 6,754,807 B1 | 6/2004 | Parthasarathy et al. |
| 6,763,426 B1 | 7/2004 | James et al. |
| 6,807,103 B2 | 10/2004 | Cavaleri et al. |
| 6,816,933 B1 | 11/2004 | Andreas |
| 6,850,443 B2 | 2/2005 | Lofgren et al. |
| 6,853,557 B1 | 2/2005 | Haba et al. |
| 6,853,573 B2 | 2/2005 | Kim et al. |
| 6,928,501 B2 | 8/2005 | Andreas et al. |
| 6,944,697 B2 | 9/2005 | Andreas |
| 6,950,325 B1 | 9/2005 | Chen |
| 6,967,874 B2 | 11/2005 | Hosono |
| 7,296,112 B1 * | 11/2007 | Yarlagadda et al. ......... 711/105 |
| 2002/0188781 A1 | 12/2002 | Schoch et al. |
| 2004/0001380 A1 | 1/2004 | Becca et al. |
| 2004/0019736 A1 | 1/2004 | Kim et al. |
| 2004/0024960 A1 | 2/2004 | King et al. |
| 2004/0039854 A1 | 2/2004 | Estakhri et al. |
| 2004/0199721 A1 | 10/2004 | Chen |
| 2004/0230738 A1 | 11/2004 | Lim et al. |
| 2005/0120163 A1 * | 6/2005 | Chou et al. ................. 711/103 |
| 2005/0144361 A1 * | 6/2005 | Gonzalez et al. ............ 711/103 |
| 2005/0160218 A1 | 7/2005 | See et al. |
| 2005/0166006 A1 | 7/2005 | Talbot et al. |
| 2005/0213421 A1 | 9/2005 | Polizzi et al. |
| 2006/0050594 A1 | 3/2006 | Park |

OTHER PUBLICATIONS

Samsung's 2GB NAND Flash Specification: ds_k9f2gxxu0m_rev10, pp. 1-41.

Intel Advanced + Boot Block Flash Memory (C3), 28F800C3, 28F160C3, 28F320C3(x16), May 2005, pp. 1-72.

Toshiba 2Gb NAND: TH58NVG1S3AFT05_030519A, May 19, 2003, pp. 1-32.

Gal et al., "Algorithms and Data Structures for Flash Memories", ACM Computing Surveys, vol. 37, No. 2, Jun. 2005, pp. 138-163.

Kennedy, J., et al., "A 2Gb/s Point-to-Point Heterogeneous Voltage Capable DRAM Interface for Capacity-Scalable Memory Subsystems", ISSCC 2004/Session 1/DRAM/11.8, IEEE International Solid-State Circuits Conference, Feb. 15-19, 2004, vol. 1, pp. 214-523.

Kim, Jae-Kwan, et al., "A 3.6Gb/s/pin Simultaneous Bidirectional (SBD) I/O Interface for High-Speed DRAM", ISSCC 2004/Session 22/DSL and Multi-Gb/s I/O 22.7, IEEE International Solid-State Circuits Conference Feb. 15-19, 2004, vol. 1, pp. 414-415.

"HyperTransport TM I/O Link Specification", Revision 2.00, Document No. HTC20031217-0036-00, Hypertransport Technology Consortium, pp. 1-325, 2001.

"IEEE Standard for High-Bandwidth Memory Interface Based on Scalable Coherent Interface (SCI) Signaling Technology (RamLink)", IEEE Std. 1596.Apr. 1996, The Institute of Electrical Electronics Engineers, Inc., pp. i-91, (Mar. 1996).

Oshima, et al., "High-Speed Memory Architectures for Multimedia Applications", Circuits & Devices, IEEE 8755-3996/97, pp. 8-13, Jan. 1997.

Gjessing, S., et al., "RamLink: A High-Bandwidth Point-to-Point Memory Architecture", Proceedings CompCon 1992, IEEE 0-8186-2655-0/92, pp. 328-331, Feb. 24-28, 1992.

Gjessing, S., et al., "Performance of the RamLink Memory Architecture", Proceedings of the Twenty-Seventh Annual Hawaii International Conference on System Sciences, IEEE 1060-3425/94, pp. 154-162, Jan. 1994.

Gjessing, S., et al., "A RAM Link for High Speed", Special Report/Memory, IEEE Spectrum, pp. 52-53, Oct. 1992.

Diamond, S.L., "SyncLink: High: High-speed DRAM for the Future", Micro Standards, IEEE Micro, pp. 74-75, Dec. 1996.

Samsung Electronics Co. LTD, "256M x8 Bit / 128 M x16 Bit / 512M x8 Bit NAND Flash Memory", K9K4G08U1M, May 6, 2005, pp. 1-41.

King, et al., "Communicating with Daisy Chained MCP42XXX Digital Potentiometers", Microchip AN747, pp. 1-8, 2001.

M-Systems Flash Disk Pioneers LTD., "DiskOnChip H1 4Gb (512MByte) and 8Gb (1 GByte) High Capacity Flash Disk with NAND and x2 Technology", Data Sheet, Rev. 0.5 (Preliminary), pp. 1-66, 2005.

Tal, A., "Guidelines for Integrating DiskOnChip in a Host System", Rev. 1.0, M-Systems Flash Pioneers Ltd., pp. 1-15, 2004.

Samsung Electronics Co. LTD, OneNAND4G(KFW4G16Q2M-DEB6), OneNAND2G(KFH2G16Q2M-DEB6), OneNAND1G(KFW1G16Q2M-DEB6) Flash Memory, OneNAND™ Specification Ver. 1.2, pp. 1-125, Dec. 23, 2005.

* cited by examiner

FLASH MEMORY SYSTEM CONTROL SCHEME

CROSS REFERENCE TO RELATED APPLICATIONS

This application claims the benefit of priority of U.S. Provisional Patent Application No. 60/788,083 filed Mar. 31, 2006, which is incorporated herein by reference in its entirety.

FIELD OF THE INVENTION

The present invention relates generally to Flash memory. More particularly, the present invention relates to a multi-device Flash memory system for mass storage applications.

BACKGROUND OF THE INVENTION

Flash memory is a commonly used type of non-volatile memory in widespread use as mass storage for consumer electronics, such as digital cameras and portable digital music players for example. The density of a presently available Flash memory chip can be up to 32 Gbits (4 GB), which is suitable for use in popular USB Flash drives since the size of one Flash chip is small.

The advent of 8 mega pixel digital cameras and portable digital entertainment devices with music and video capabilities has spurred demand for ultra-high capacities to store the large amounts of data, which cannot be met by the single Flash memory device. Therefore, multiple Flash memory devices are combined together into a memory system to effectively increase the available storage capacity. For example, Flash storage densities of 20 GB may be required for such applications.

FIG. 1 is a block diagram of a prior art Flash memory system 10 integrated with a host system 12. Flash memory system 10 includes a Flash memory controller 14 in communication with host system 12, and multiple non-volatile memory devices 16. The host system will include a processing device such as a microcontroller, microprocessor, or a computer system. The Flash memory system 10 of FIG. 1 is configured to include one channel 20, where memory devices 16 are connected in parallel to channel 20. Those skilled in the art will understand that the memory system 10 will have any number of memory devices connected to it.

Channel 20 includes a set of common buses, which include data and control lines that are connected to all its corresponding memory devices. While not shown, each memory device is enabled/disabled with a respective chip select signal provided by Flash memory controller 14. The Flash controller 14 is responsible for issuing commands and data, via the channel, to a selected memory device based on the operation of the host system 12. Data read from the memory devices is transferred via the channel back to the Flash memory controller 14 and host system 12. Flash memory system 10 is generally referred to as a multi-drop configuration, in which the memory devices 16 are connected in parallel with respect to channel 20.

In Flash memory system 10, non-volatile memory devices 16 are identical to each other, and are typically implemented as NAND Flash memory devices. Those skilled in the art will understand that Flash memory is organized into banks, and each bank is organized into blocks to facilitate block erasure. Most commercially available NAND Flash memory devices are configured to have two banks of memory. Prior to a discussion of the operation of Flash memory system 10, a brief overview of a single NAND Flash memory device memory core is described.

FIG. 2 is a general block diagram of one bank of a known NAND Flash memory. Bank 30 is organized into k+1 blocks. Each block consists of NAND memory cell strings, having up to i+1 Flash memory cells serially connected to each other. Accordingly, wordlines WL0 to WLi are connected to the gates of each Flash memory cell in the memory cell string. A string select device connected to signal SSL (string select line) selectively connects the memory cell string to a bitline, while a ground select device connected to signal GSL (ground select line) selectively connects the memory cell string to a source line, such as VSS. The string select device and the ground select device are n-channel transistors. There are j+1 bitlines common to all blocks of bank 30, and each bitline is connected to one NAND memory cell string in each of blocks [0] to [k]. Each wordline (WL0 to WLi), SSL and GSL signal is connected to the same corresponding transistor device in each NAND memory cell string in the block. As those skilled in the art should be aware, data stored in the Flash memory cells along one wordline is referred to as a page of data.

Connected to each bitline outside of the bank 30 is a data register 32 for storing one page of write data to be programmed into one page of Flash memory cells. Data register 32 also includes sense circuits for sensing data read from one page of Flash memory cells. During programming operations, the data registers perform program verify operations to ensure that the data has been properly programmed into the Flash memory cells connected to the selected wordline. Programming within a block typically starts at the page corresponding to WL0, and proceeds sequentially up to WLi to fill the present block. Then programming continues with WL0 of a new block. Within a device, blocks are programmed in sequence.

Returning to the Flash memory system 10 of FIG. 1, there are specific issues that will adversely impact performance of the system. Some are physical while others are architectural.

The configuration of Flash memory system 10 imposes physical performance limitations. With the large number of parallel signals running across the system, the signal integrity of the signals they carry will be degraded by crosstalk, signal skew, and simultaneous switching noise (SSN). Power consumption in such a configuration becomes an issue as each signal track between the flash controller and flash memory devices is frequently charged and discharged for signaling. With increasing system clock frequencies, the power consumption will increase as well.

From an architectural perspective, programming operations will take too much time. A primary function of the Flash controller 14 is to manage the writing of data to the memory devices in the system. In the Flash memory context, writing of data is more commonly referred to as programming data. There are two significant issues related to Flash programming. First, Flash programming is slow relative to volatile memories such as DRAM and SRAM, and other non-volatile memories such as hard disk drives. Programming data to Flash memory cells requires high voltages and a stepped programming sequence to obtain a tight programmed threshold voltage distribution. In a NAND Flash memory device having two banks of memory, two pages of data are concurrently programmed, one for each bank. Since there is only one data register per bank, further programming operations must wait until the current pages have been successfully programmed. Therefore, programming large quantities of data to the Flash devices 16 may require a significant amount of time.

A second issue with the conventional Flash memory system 10 is the linear file structure of the program data. FIG. 3 is an illustration of the conventional file structure for a Flash memory system 50 having four memory devices. In FIG. 3, each memory device 52, 54, 56 and 58 has a total of n physical pages of storage space, which are divided among any number of blocks. In the presently shown example, it is assumed that the n pages are divided equally between two banks. Most Flash memory systems will store a data file consisting of a number of data pages, linearly within one memory device. For example, the first page of the data file is stored in Page 0 of device 52, and successive data pages are progressively stored in subsequent pages. Once device 52 is full, then further data files to be stored in system 50 starts at Page 0 in device 54, and so forth. Arrow 60 shows the storage pattern of data being written to the Flash memory system 50.

This linear file structure coupled with the relatively long programming time per page of the data file per memory device, results in a Flash memory system that requires significant time to store data. Another issue which is related to the linear file structure is device reliability, and more specifically, program/erase wearing of one memory device relative to the other memory devices in the system. Program/erase wearing refers to a progressive degradation of a Flash memory cell due to cumulative program and erase operations. The effect of such cumulative program and erase operations is the alteration of the program and erase characteristics of the memory cell beyond optimal parameters. When memory cells are degraded, higher program and erase voltages are needed to program or erase the memory cells to the desired threshold voltages. Eventually, the memory cells will fail to function properly. This is the reason that Flash memory are rated for a limited number of erase-program cycles, which is between 10,000 and 100,000 cycles.

If for example, the first memory device 52 in FIG. 3 endures more program and erase cycles than any of the other memory devices, memory device 52 will likely fail before the others. When memory device 52 fails, the entire system 50 is no longer usable since the memory devices are packaged together and replacement of a single memory device is impractical. This is an unfortunate waste of memory devices, as the remaining devices in the system are still useful and may have significant life left.

An inherent technical architecture of most Flash memory is that the smallest unit of memory which is erasable is a block of memory. This means that if even one page within the block is to be modified, the entire block must be re-programmed along with the new page. This is referred to as block re-programming, which requires significant programming time and hence negatively impacts performance of the system.

Therefore, presently known Flash memory systems have slow throughput for programming data, and due to the unequal program and erase wearing across the devices, the entire system will have a lifespan limited to the first memory device to fail.

It is, therefore, desirable to provide a high speed Flash memory system architecture having a scheme for maximizing the lifespan of the system.

SUMMARY OF THE INVENTION

It is an object of the present invention to obviate or mitigate at least one disadvantage of previous control schemes for Flash memory systems. In particular, it is an object of the present invention to improve Flash memory system programming throughput by interleaving programming operations in each Flash memory device of the system.

In a first aspect, the present invention provides a method for controlling first and second Flash memory devices connected to a channel. The method includes executing a first operation in the first Flash memory device in response to a first command, and initiating a second operation in the second Flash memory device in response to the a second command, while the first Flash memory device is executing the first operation.

In an embodiment of the present aspect, the first Flash memory device and the second Flash memory device are serially connected to each other, and the second command is passed to the second Flash memory device through the first Flash memory device before the step of initiating. In further embodiments, the step of executing the first operation includes programming at least one page of a data file in the first memory device. The second operation includes initiating programming of at least one other page of the data file in the second memory device, while the method further includes initiating a third operation in the first Flash memory device in response to a third command. The second operation includes initiating a read operation of data in the second memory device or initiating an erase operation in the second memory device. In yet another embodiment, executing the first operation includes one of a read operation and an erase operation in the first memory device.

In a second aspect, the present invention provides a method for high speed wear leveling programming in a Flash memory system having a plurality Flash memory devices. The method includes receiving a data file having k pages, k being an integer greater than 0; selecting a programming profile corresponding to the size of k and configuration parameters of the Flash memory system; and programming at least one of the k pages of the data file in each of to at least two of the plurality of Flash memory devices in accordance with the selected programming profile.

According to an embodiment of the present aspect, the configuration parameters includes j Flash memory devices, and each of the j Flash memory devices have i pages per block, where j and i are integer values greater than 0. The step of selecting includes calculating a ceiling function of z, where $z=k/i$, and the programming profile includes a single file structure for storing k pages of the data file in z of j Flash memory devices when z is less than or equal to j. The step of programming includes sequentially providing program commands to each of the z Flash memory devices for programming the k pages, where each program command programs the at least one of the k pages.

In another embodiment of the present aspect, the programming profile includes a multiple file structure when z is greater than j. The multiple file structure includes storing m units of $j*i$ pages of the data file in j Flash memory devices, and storing $k-(m*j*i)$ pages of the data file in z of j Flash memory devices when z is less than or equal to j, where m is an integer value greater than 0. The step of programming includes sequentially providing program commands to each of the j Flash memory devices for programming the $j*i$ pages of the data file, where each program command programs the at least one of the k pages. The step of programming further includes sequentially providing program commands to each of the z Flash memory devices for programming the $k-(m*j*i)$ pages, where each program command programs the at least one of the k pages.

In a third aspect, the present invention provides a data file storage architecture for a memory system having at least two memory devices connected to the same channel. The data file storage architecture includes portions of the data file stored in two of the at least two memory devices. According to embodiments of the present aspect, the portions are substantially equal in size to each other, and the portions are stored in each of the at least two memory devices of the memory system.

In a fourth aspect, the present invention provides a method for high speed wear leveling programming in a Flash memory system having j Flash memory devices, where each of the j Flash memory devices has i pages per block, where j and i are integer values greater than 0. The method includes receiving a data file having k pages, k being an integer greater than 0; providing commands for programming k pages within z of j memory devices if a ceiling function of z=k/i is less than or equal to j; providing commands for programming j*i pages within j memory devices if the ceiling function of z=k/i is greater than j; updating k by setting k=k−(j*i); and repeating the step of programming updated k pages.

In a fifth aspect, the present invention provides a Flash memory system. The Flash memory system includes a controller, a first Flash memory device, and a second Flash memory device. The controller has a channel for providing a first command and a second command. The first Flash memory device is coupled to the channel for executing a first operation in response to the first command. The second Flash memory device is coupled to the channel for initiating a second operation in response to the second command while the first Flash memory device is executing the first operation.

According to embodiments of the present aspect, the first Flash memory device and the second Flash memory device are serially connected to each other, and the second command is passed to the second Flash memory device through the first Flash memory device. The first operation includes a programming operation, and the first Flash memory device programs at least one page of a data file. The second operation includes another programming operation, and the second Flash memory device programs at least one other page of the data file.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

A Flash memory system architecture having serially connected Flash memory devices to achieve high speed programming of data. High speed programming of data is achieved by interleaving pages of the data amongst the memory devices in the system, such that different pages of data are stored in different memory devices. A memory controller issues program commands for each memory device in a bitstream having one or more signal lines. As each memory device receives a program command, it either begins a programming operation or passes the command to the next memory device. Therefore, the memory devices in the Flash system sequentially program pages of data one after the other, thereby minimizing delay in programming each page of data into the Flash memory system. The memory controller executes a wear level control algorithm to optimize programming performance and endurance for data of any size.

Figure 4:
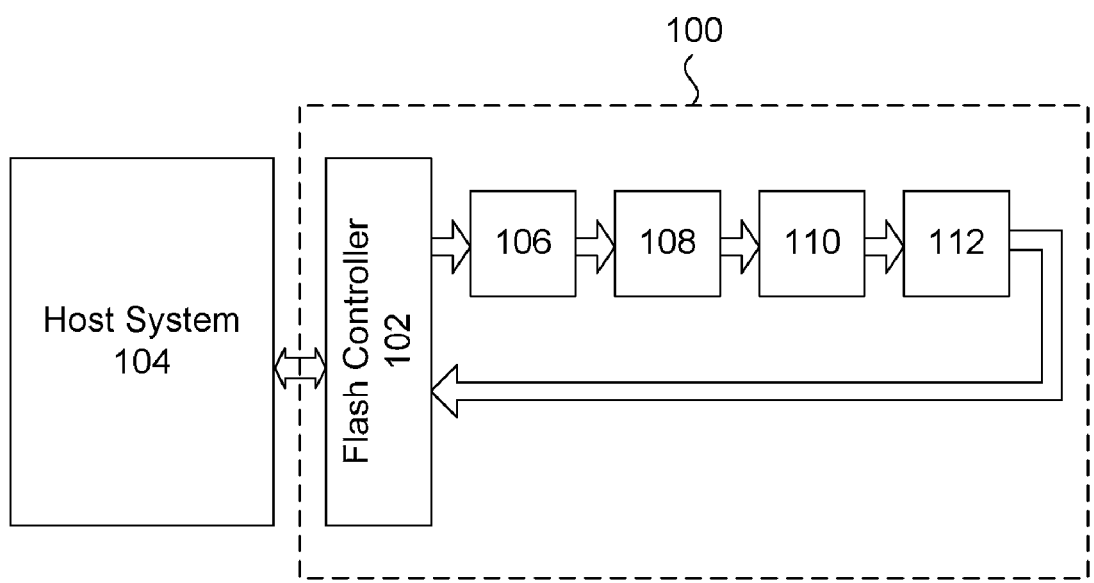
FIG. 4 is a block diagram of a Flash memory system according to an embodiment of the present invention.

FIG. 4 is a block diagram of a Flash memory system having serially connected memory devices for executing high speed data programming operations with wear level control, according to an embodiment of the present invention. Flash memory system 100 includes a Flash memory controller 102 in communication with host system 104, and four serially connected Flash memory devices 106, 108, 110 and 112. While four memory devices are shown in the present embodiment, the embodiments of the present invention will be effective for memory systems having at least two memory devices. Each of the four Flash memory devices have a serial input/output interface circuit for facilitating serial operation between memory devices. An example of a such a Flash memory device is described in commonly owned U.S. patent application Ser. No. 11/324,023, filed on Dec. 30, 2005, and commonly owned U.S. patent application Ser. No. 11/496,278, filed on Jul. 31, 2006., the contents of which are incorporated herein by reference. The Flash memory device of U.S. patent application Ser. No. 11/324,023 is referred to as a multiple independent serial link device (MISL). As in the system shown in FIG. 1, the host system will include a processing device such as a microcontroller, microprocessor, or a computer system.

Flash memory device 106 is the first device in the chain, and receives commands, such as read, program and erase commands, from Flash memory controller 102. In the MISL Flash device of U.S. patent application Ser. No. 11/324,023, all commands, data and address information are received as a serial bitstream. The commands include data information, address information, and any other information required by the memory device for executing a particular operation. As each Flash memory device should include flow-through logic circuitry, any received command not intended for a particular device is passed to the next Flash memory device, and so forth, until it is acted upon by the intended Flash memory device. The last Flash memory device 112 in the chain has outputs connected to the Flash memory controller 102, for providing read data in response to a read command. The presently shown embodiment of FIG. 4 has one channel for sending and receiving data from the chain of Flash memory devices. Those skilled in the art will understand that Flash memory controller 102 will optionally have multiple channels for accommodating a corresponding number of Flash memory device chains. Since each Flash memory device is preferably positioned in close proximity with the other, conducting wires interconnecting the Flash memory devices to each other will be minimized. Therefore, there are no physical performance limitations related to bus line length, as in Flash memory system 10 of FIG. 1.

Figure 5:
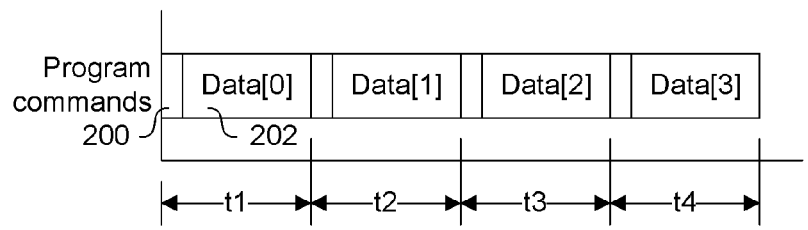
FIG. 5 is a timing diagram of program commands issued by the Flash controller of FIG. 4, according to an embodiment of the present invention.
Figure 6:
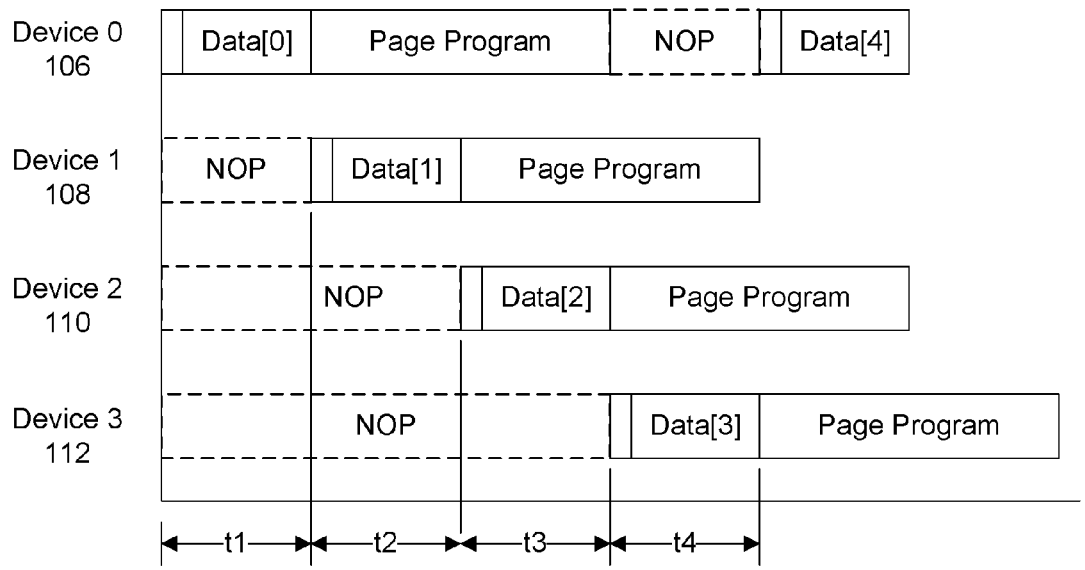
FIG. 6 is a timing diagram showing program commands received by each memory device of the Flash memory system in FIG. 4.

As previously discussed, the Flash memory controller 102 is responsible for issuing program commands for each Flash memory device. For high speed programming of data according to an embodiment of the present invention, pages of a data file are programmed to different memory devices. This is done by issuing program commands serially one after the other to initiate program operations in each Flash memory device in rapid succession. FIGS. 5 and 6 will help illustrate how such high speed programming is achieved.

FIG. 5 is a timing diagram illustrating the issuance of program commands by the Flash memory controller 102 for maximizing overall programming speed for the Flash memory system 100, according to an embodiment of the present invention. In the presently shown example, four program commands Data[0], Data[1], Data[2] and Data[3] are issued serially at respective time periods t1 to t4 by Flash memory controller 102 to program one data file. The identification number within square brackets for each program command indicates the sequential order the program command was issued from the Flash memory controller 102. Each programming command will include, but is not limited to, a command 200 and at least one page of data 202 for a specific memory device. The command 200 includes an address to which the page of data is to be programmed, and a device identifier for matching the programming command to the specific memory device. Flash memory devices 106, 108, 110 and 112 are responsive to program commands Data[0], Data[1], Data[2] and Data[3] respectively. Since the Flash memory devices are serially connected and the program commands are issued serially, the core programming operations of each Flash memory device overlap with the operations of the subsequent Flash memory device, with the exception of the last Flash memory device that receives a programming command.

If it is assumed that each programming command requires about 85 microseconds to transfer to the memory device (time t1), then the total sequence for transferring the four program commands will require 4×85 microseconds=340 microseconds. The time required for programming the at least one page of data per memory device is fixed, and assumed to be about 200 microseconds. Therefore, the total elapsed time for programming all the data to the Flash memory system 100 will be about 340 microseconds+200 microseconds=540 microseconds. The 200 microsecond programming time is contributed by the last memory device to receive a programming command. In contrast, programming 4 pages to the same memory device will take 1140 microseconds. The overlapping programming operations of the Flash memory devices is more clearly shown in the expanded timing diagram of FIG. 6.

FIG. 6 is an expanded timing diagram showing the operations of Flash memory devices 106, 108, 110 and 112 in response to respective program commands Data[0], Data[1], Data[2] and Data[3]. The time periods t1 to t4 correspond to the same time periods shown in FIG. 5. The programming sequence of FIG. 6 will now be described with reference to the flow chart of FIG. 7. The Flash system programming control embodiment described in FIG. 7 will be referred to as a high speed interleaved programming method, whereby programming operations are interleaved between different memory devices. The method begins at step 300 where at least two program commands are provided serially to the first memory device 106 in the system. The first program command corresponds to program command Data[0] while the second program command corresponds to program command Data[1]. At step 302, memory device 106 receives program command Data[0] during a first time period t1, which is followed by a program operation at step 304. During time period t1, program command Data[0] is transferred to memory device 106 while memory devices 108, 110 and 112 remain in a no operation (NOP) state.

As soon as program command Data[0] has been transferred to memory device 106, the second program command Data[1] is received by memory device 108 during a second time period t2 at step 306. A program operation follows at step 308, and because the programming operation for memory device 106 has already commenced at the end of time period t1, there is a period of time where both memory devices 106 and 108 are executing programming operations at the same time. The process would repeat in the same manner for the next program command and memory device. In the present example, programming operations in memory devices 106 and 108 will have been completed by the end of time period t4. The programming operation in memory device 110 will be completed as the programming operation in memory device 112 continues.

The above example presents a scenario where the first memory device to receive a command is 106. Alternately, any one of the memory devices in the system can be the first memory device to receive the first program command. A fifth program command is issued to memory device 106 after time period t4, provided that device 106 has finished its programming operation. Those skilled in the art will understand that different Flash memory devices will have varying programming times. In the presently shown example of FIG. 6, memory device 106 has finished programming its data at the beginning of time period t4, therefore it is ready to receive the next program command Data[4] as soon as memory device 112 has finished receiving program command Data[3]. If the Flash memory device has a very long core programming time, then the Flash memory controller will need to wait until memory device 106 has completed programming operations before issuing the Data[4] program command. Flash memory devices will typically provide a ready status signal to the Flash memory controller to indicate when a programming operation is completed.

Figure 7:
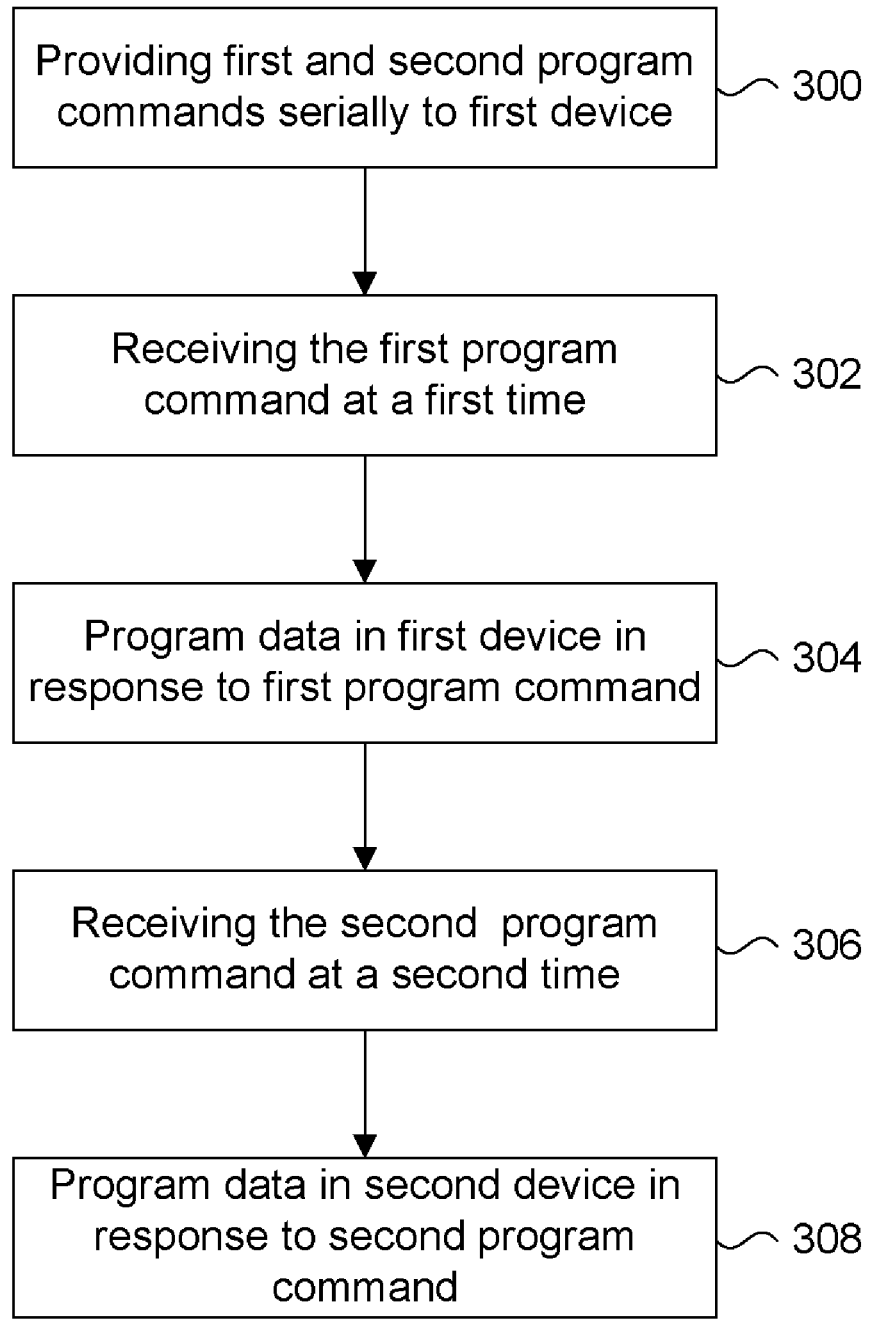
FIG. 7 is a flow chart illustrating a high speed interleaved programming method, according to an embodiment of the present invention.
Figure 8:
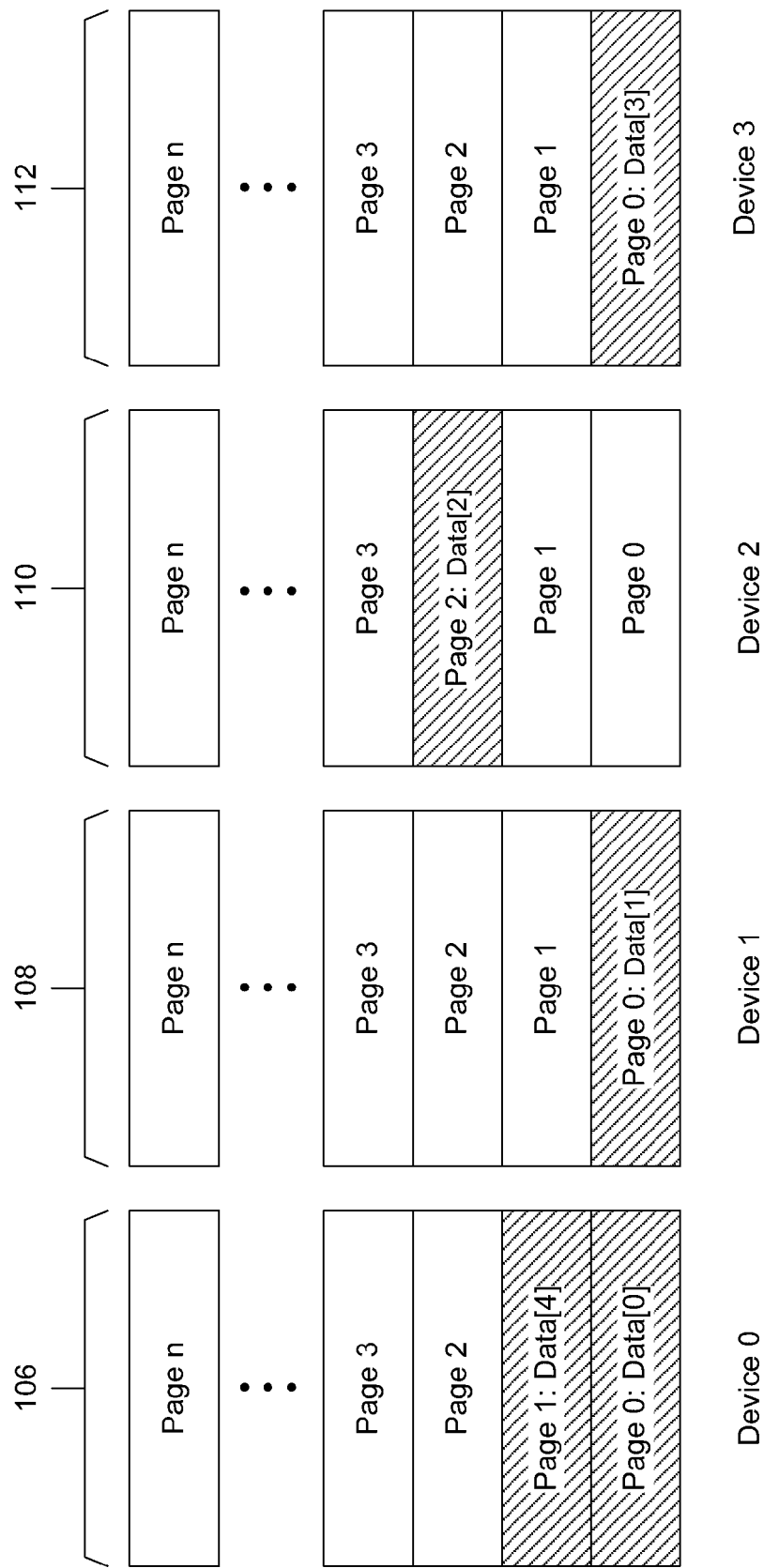
FIG. 8 is a graphical illustration of a file structure in the Flash memory system in FIG. 4 resulting from the high speed interleaved programming method of FIG. 7.

FIG. 8 is a graphical file structure illustration of Flash memory devices 106, 108, 110 and 112 after the high speed programming sequence described in FIG. 6 and FIG. 7 has been executed for program commands Data[0], Data[1], Data[2], Data[3] and Data[4]. The file structure shown in FIG. 8 assumes that memory blocks of devices 106, 108 and 112 are empty prior to programming. This is why pages are programmed to physical page 0 of these devices. In memory device 110 on the other hand, the memory block may have other data in physical pages 0 and 1. Therefore, Data[2] is programmed to the next available page in the block, which is in physical page 2. As shown in FIG. 8, physical page 1 of memory device 106 is the last page to be programmed in the presently shown high speed programming sequence. The next programming sequence will start programming data at physical page 1 of memory device 108, and will proceed in the same manner as previously described for the programming sequence shown in FIG. 6. Therefore, maximum programming speed of Flash memory system 100 is obtained when program commands are serially issued to consecutive serially connected memory devices. In other words, a file structure in which data is distributed across the maximum number of memory devices in the serially interconnected Flash memory system will result in highest speed programming of a data file. It should be noted that data does not necessarily need to be programmed in the same physical page number across all the memory devices.

While high speed programming is beneficial to systems using Flash memory system 100, some systems may require maximized endurance of the Flash memory system 100. The file structure shown in FIG. 8 will not maximize program/erase wear across all memory devices, mainly due to the block erase architecture of Flash memory devices. For example, if a 20 page data file is interleaved programmed across one block in each memory device, then there is a possibility that all four memory devices will need to perform a block erase before updating the data file. In contrast, if all 20 pages were stored in one block of one memory device, then only that block needs to be erased.

Therefore, according to another embodiment of the invention, the above described high speed programming control method is adjusted to minimize program/erase wear, or to optimize programming performance and program/erase wear. More specifically, the Flash controller 102 of FIG. 4 executes a program control algorithm for optimizing program performance and program/erase wear based on predetermined criteria. This predetermined criteria will include characteristics of the data to be programmed and characteristics of the memory devices of the Flash memory system. Data characteristics include the number of pages of the data to be programmed, and memory device characteristics include the number of pages per block.

Figure 9:
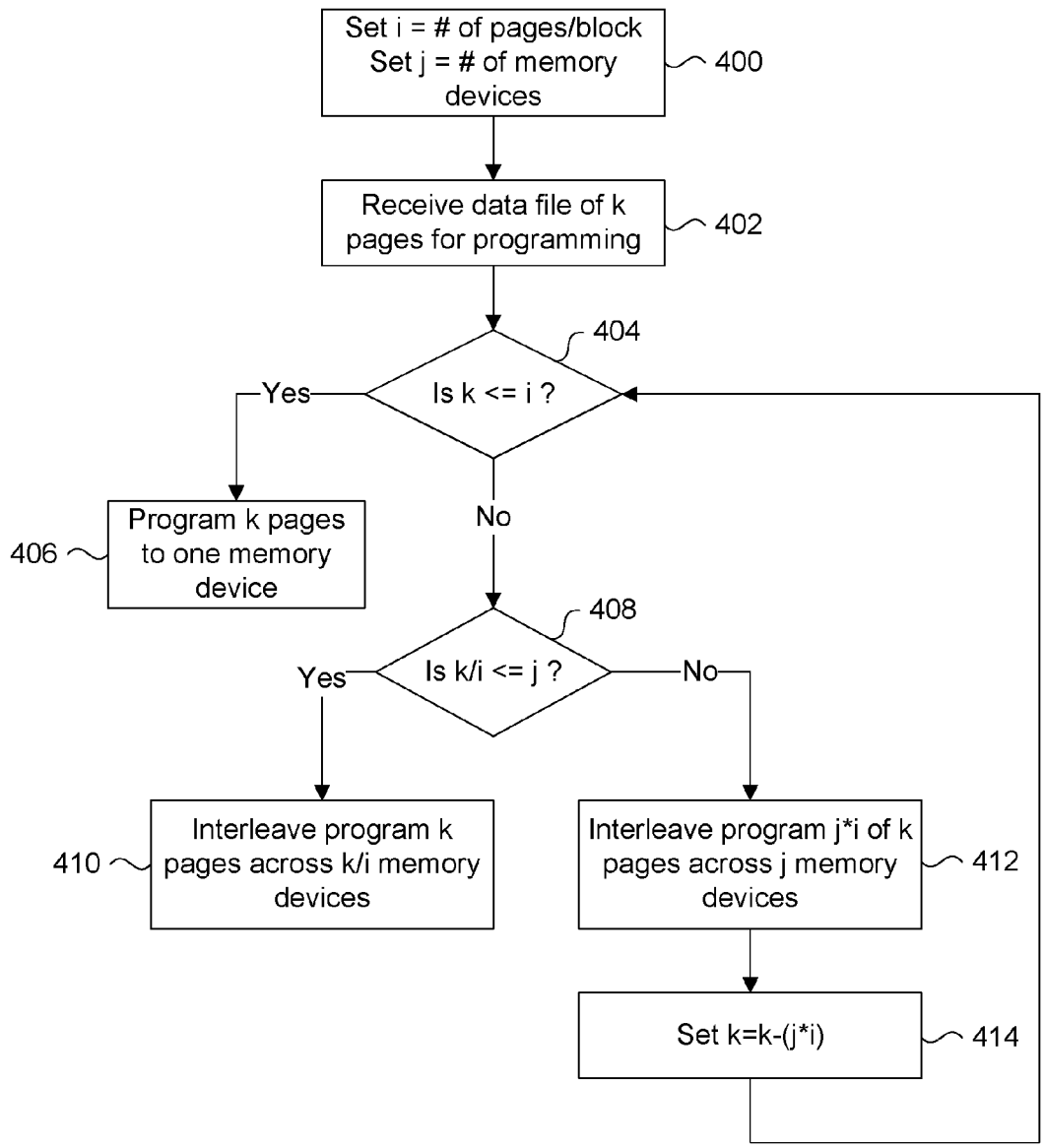
FIG. 9 is a flow chart illustrating a high speed wear leveling programming method, according to an embodiment of the present invention.

FIG. 9 is a flow chart illustrating an embodiment for programming multiple Flash memory devices in a Flash memory system with high speed and with wear leveling control. This program control embodiment will be referred to as a high speed wear leveling programming method. Wear leveling refers to a scheme for prolonging the life of the Flash memory system. The presently described embodiment will optimize wear leveling and performance for any data file to be programmed, by using a variety of programming profiles. A programming profile generally corresponds to a programming sequence for storing pages of a data file with a specific file storage structure. Ultimately, the programming profile distributes pages of the data file across the memory devices of the Flash memory system. The presently described method is executable by a memory controller, such as Flash controller 102 of FIG. 4, in a system of serially connected memory devices.

The high speed wear leveling programming method starts at step 400 where a variable i is set to be the number of pages per block in each memory device of the Flash memory system, and a variable j is set to be the number of memory devices in the Flash memory system. It is presumed that all the memory devices in the Flash memory system are identical to each other, and have the same block size. This information is pre-programmed into the memory controller. At step 402, a data file consisting of a number of pages k, is received by the memory controller for programming. Proceeding to step 404, a calculation is made to determine if k is less than or equal to i. If k is less than or equal to i, meaning that the data file is less than or equal to one block of storage space in a memory device, then all k pages of the data file are programmed to one block of one memory device at step 406. This is an example of a programming profile having a single file structure. The memory controller selects the specific memory device to which the data file will be programmed to in accordance with one or more selection parameters. For example, one selection parameter is the memory device with the highest number of remaining program/erase cycles, while another selection parameter includes the last memory device to be programmed to.

On the other hand, if k is greater than i, meaning that the data file includes more pages than one block of storage space in a memory device, then the method proceeds to step 408. At step 408, a calculation is made to determine if k/i is less than or equal to j. It should be noted that the calculation of k/i should yield integer numbers only. Since the present method determines the minimum number of blocks required for storing the k data, a non-integer result having a whole number and decimal portion (ie. a real number) indicates that one block more than the whole number is required. This is done through known mathematical functions such as a ceiling function. Those skilled in the art will understand that a ceiling function returns the smallest integer that is not less than the real number. On the other hand, a direct integer result from k/i does not require further mathematical processing. From this point forward, reference to the k/i result will presume that a ceiling function has been applied to it.

If the k/i integer value is less than j, the number of memory devices in the Flash memory system, then the k pages of the data file are interleave programmed between k/i memory devices in step 410. This is another example of a programming profile having a single file structure. The interleave programming will proceed as previously described in the method of FIG. 7. In a practical example, if I =32, j =4 and k =61, then k/i=1.90. Since k/i results in a real number, a ceiling function applied to 1.90 results in the integer number 2. Hence in step 410, all k=61 pages are interleave programmed across 2 memory devices. The memory controller selects any two memory devices in the Flash memory system, whether they are directly connected together or indirectly connected together. Two indirectly connected memory devices can have at least one intervening memory device connected between them. Since the data file is programmed within two memory devices, about half of the pages are programmed in one memory device and the remainder is stored in the other memory device.

If k/i is at least j, the number of memory devices in the system, then different optimization programming sequences, will be used for programming differently sized groups of the data file. More specifically, very large data files are treated as multiple units of smaller data files, which are programmed according to any one of the previously described programming sequences. Continuing at step 412, all page locations in one block of each memory device is programmed with j*i pages of the k pages of the data file, according to the interleaved programming sequence of step 410. Following at step 414, the number of pages k is updated by setting it equal to k−(j*i). Therefore, the remaining number of pages to be programmed is calculated. The method loops back to step 404 to repeat the decision tree processing and programming sequences based on the updated value of k. In summary, the present method will iteratively program multiple units of j*i pages of the data file using the same file structure for each unit of j*i pages, and then program the remaining k−(j*i) pages using a different file structure. Hence the present method has a programming profile consisting of multiple file structures for the data file.

A practical example will now be used to illustrate this embodiment. If I =32, j =4 and k =192, then the first 128 pages will be programmed across all the memory devices as described in step 412. At step 414, k is updated to be 192−(128)=64. Then the remaining 64 pages are programmed across two memory devices as described in step 410. As previously mentioned, any two memory devices are selected for programming the remaining 64 pages. While the presently described embodiment illustrates a method where programming is followed by recalculation of k, the entire sequence can be determined by the Flash controller in advance and before any programming operations begin by employing the above described calculations. While it is presumed that the first pages of the data file to be programmed are the j*i pages, the first pages to be programmed can be the k−(j*i) pages instead, followed by the multiple units of j*i pages.

The presently described high speed wear leveling programming method has been described for a Flash memory system having a single channel, such as the embodiment shown in FIG. 4. The previously described embodiments of the invention are executed in a Flash memory system having two or more channels. In such alternate embodiments, at least two data files are concurrently programmed; a first data file in one channel and a second data file in another channel.

Additionally, the present embodiment has been described in operation with memory devices having a single memory bank. Of course, memory devices having two or more memory banks can be used. With two memory banks, there will be two available page buffers for storing up to two pages of data. In a multi-bank device configuration, several programming options are available. In a first option, all the pages of data to be programmed to one memory device are programmed to one block within one bank of the memory device. The operation would be analogous to a memory device having only one memory bank. In a second option, two pages of the data file are loaded into one memory device concurrently, or in a single program command. This will effectively increase programming throughput as each memory device will program two pages at the same time. In a third option, programming operations are interleaved between banks of the memory devices. For example, programming pages to two memory devices will proceed in the following sequence: device 1 [bank 1], device 2 [bank 1], device 1 [bank 2], and device 2 [bank 2]. The programming sequence should be obvious for memory devices having more than 2 banks.

Figure 1:
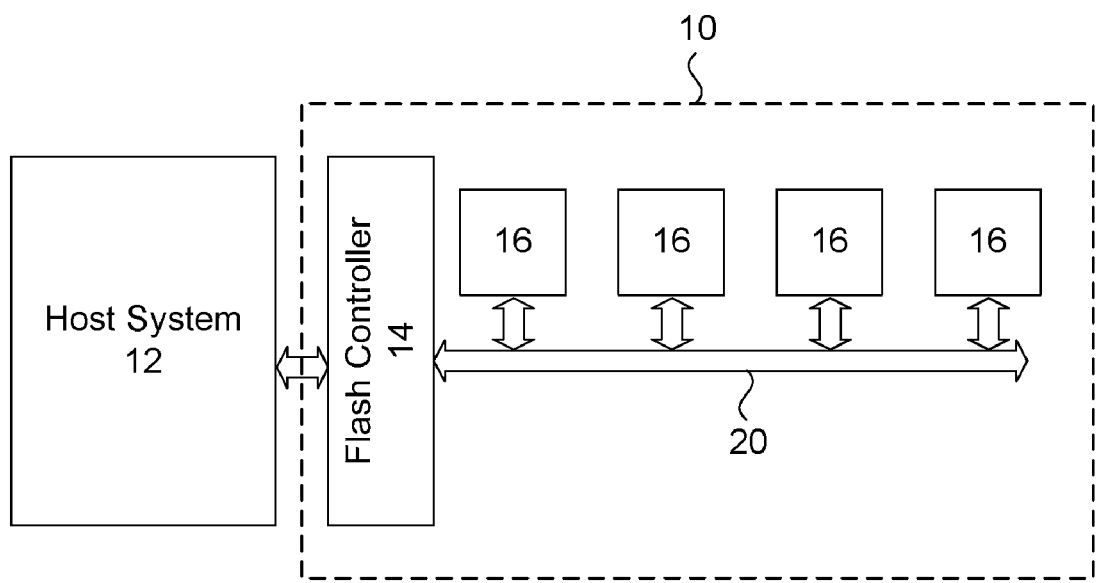
FIG. 1 is a block diagram of a prior art Flash memory system.
Figure 2:
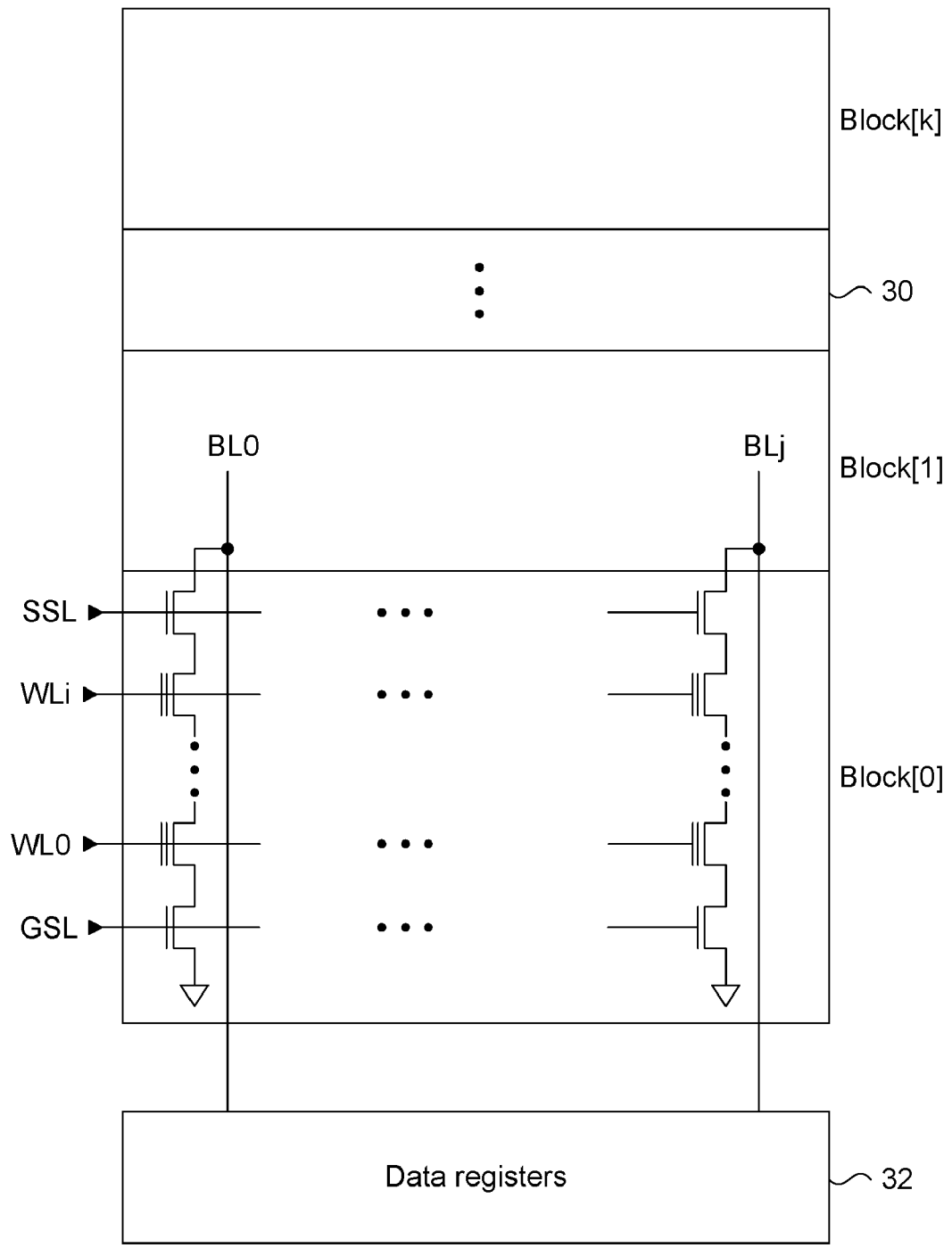
FIG. 2 is a schematic of a prior art NAND Flash memory core.
Figure 3:
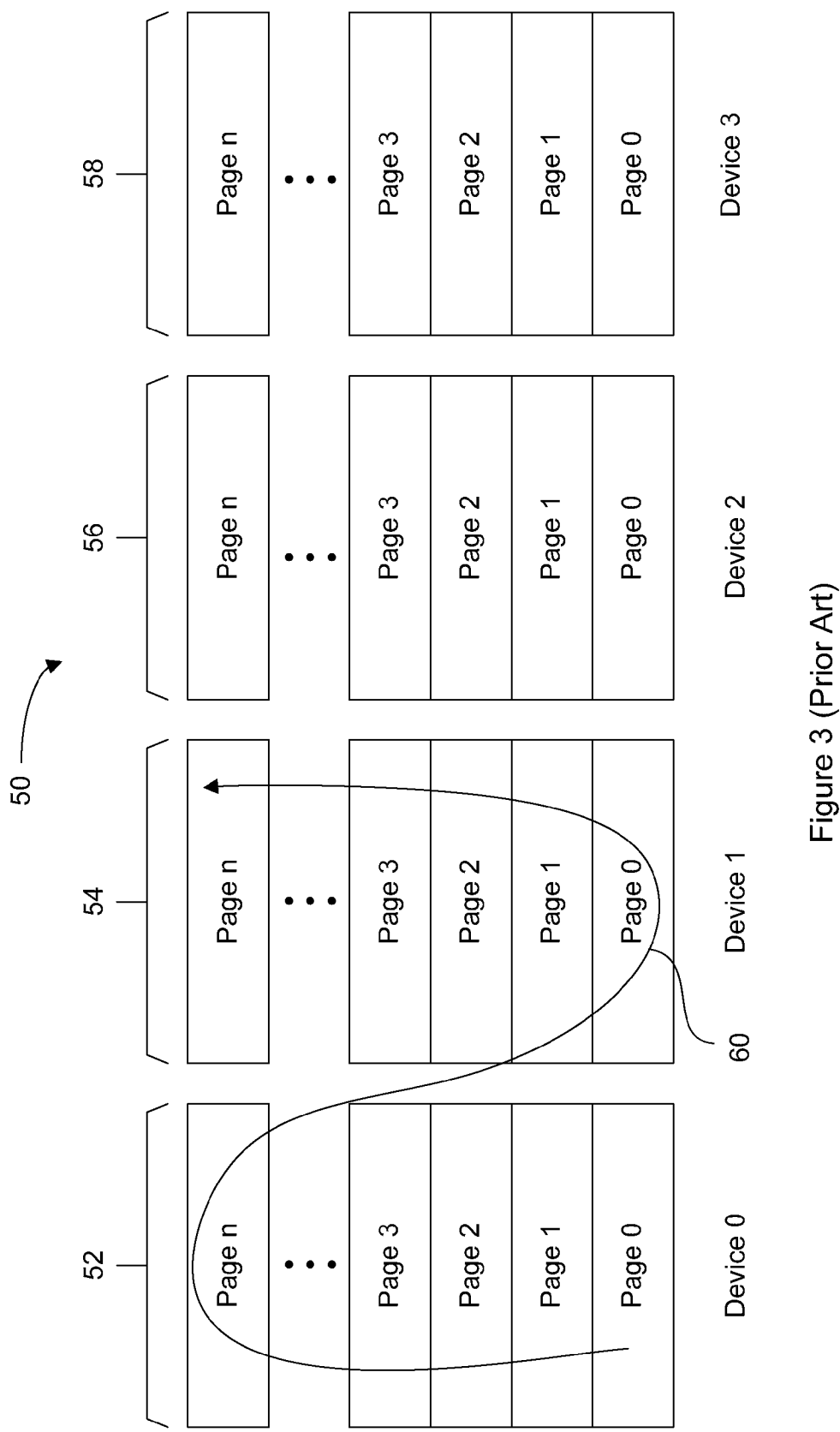
FIG. 3 is an illustration of a conventional file structure for a Flash memory system.

Furthermore, while the previously described high speed wear leveling programming method has been described for Flash memory systems having serially connected, or daisy-chained memory devices, the embodiments are applicable to multi-drop configured Flash systems such as the one shown in FIG. 1. This is done by enabling the appropriate memory device and providing the corresponding command data onto the common busses at different times.

The previously described embodiments of the invention illustrate examples where programming operations in the Flash memory system of FIG. 4 are interleaved. According to another embodiment of the invention, interleaved program and read operations are executed by the Flash memory system of FIG. 4.

Figure 10:
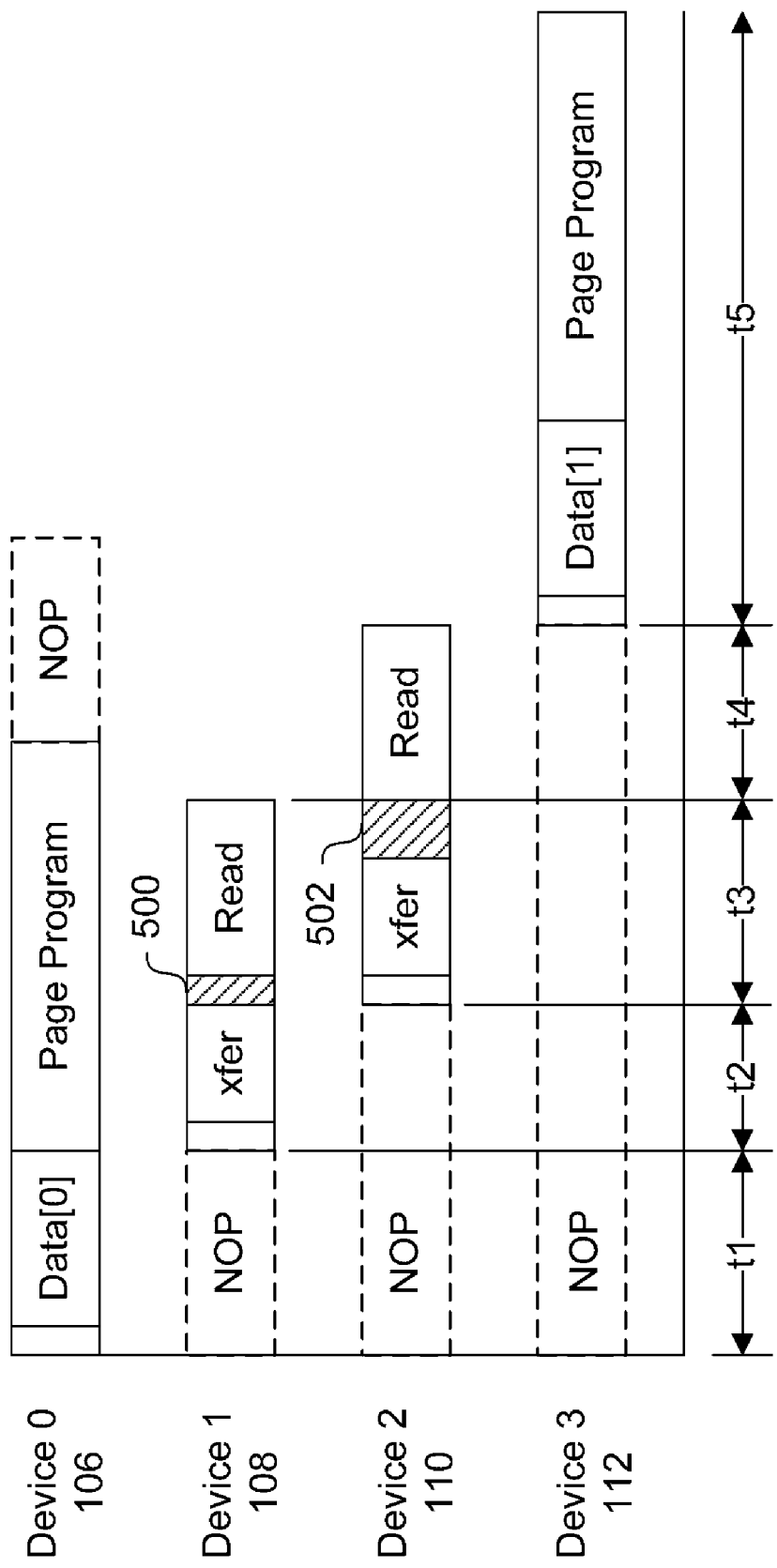
FIG. 10 is a timing diagram showing interleaved program and read operations.

FIG. 10 is a timing diagram illustrating high speed interleaved read and program operations for the Flash memory system of FIG. 4. In this example, memory devices 106 and 112 are to be programmed with data, while memory devices 108 and 110 are to provide read data. During time period t1, memory device 106 receives a program command Data[0], and then immediately commences core internal sequences for programming the data. At the beginning of time period t2, a read command is received by memory device 108, and internal data transfer operations (xfer) proceed. An internal data transfer operation will take 20 micro seconds for example, for reading out the data and loading the data registers, after which time the Flash controller will issue the read command for memory device 110 at the beginning of time period t3. An internal NOP period 500 is entered by memory device 108 to allow flow-through of a command to a downstream memory device before outputting data from its data registers.

Memory device 110 will commence its internal data transfer operation after receiving its respective read command. However, now that the signal lines between memory devices 108 and 110 are unused, upstream memory device 108 will begin outputting the data in its data registers to memory device 110, which passes the data through to memory device 112. This is done in a sequential manner, for example. At the end of time period t3, memory device 108 will have finished outputting all its read data, thereby allowing memory device 110 to start outputting its read data at the start of time period t4. Since memory device 110 cannot output its data until memory device 108 has finished outputting its data, an internal NOP period 502 is entered. At the end of time period t4, the signal lines between memory devices 110 and 112 will be unused as all the data from memory device 110 has been outputted through memory device 112. Hence at the beginning of time period t5, memory device 112 will receive program command Data[1].

While interleaved read and program operations have been illustrated, interleaved read, program and erase operations are executable in any combination.

The previously described high speed interleaved programming method is used to maximize programming performance in a Flash memory system having serially connected memory devices. High speed interleaved programming is applied to data files of any size. However, to improve endurance of all the memory devices, a high speed wear leveling programming method is used to distribute the pages of a data file with a file structure based on a size of the data file. While the embodiments are directed to Flash memory devices, the embodiments of the invention are applicable to other memory devices in which pages of data files are programmed or written to at least two memory devices.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

Embodiments of the invention can be represented as a software product stored in a machine-readable medium (also referred to as a computer-readable medium, a processor-readable medium, or a computer usable medium having a computer-readable program code embodied therein). The machine-readable medium can be any suitable tangible medium, including magnetic, optical, or electrical storage medium including a diskette, compact disk read only memory (CD-ROM), memory device (volatile or non-volatile), or similar storage mechanism. The machine-readable medium can contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention can also be stored on the machine-readable medium. Software running from the machine-readable medium can interface with circuitry to perform the described tasks.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A method for high speed wear leveling programming in a Flash memory system having a plurality Flash memory devices, comprising:

i) receiving a data file having k pages, k being an integer greater than 0;

ii) selecting a programming profile corresponding to the size of k and configuration parameters of the Flash memory system by calculating a ceiling function of $z=k/i$, the configuration parameters including j Flash memory devices where each of the j Flash memory devices have i pages per block, where j and i are integer values greater than 0;

iii) programming at least one of the k pages of the data file in each of at least two of the plurality of Flash memory devices in accordance with the programming profile including a multiple file structure when z is greater than j, the multiple file structure including storing m units of j*i pages of the data file in j Flash memory devices, and storing k−(m*(j*i)) pages of the data file in z of j Flash memory devices when z is less than or equal to j, where m is an integer value greater than 0.

2. The method of claim 1, wherein the step of programming includes sequentially providing program commands to each of the j Flash memory devices for programming the j*i pages of the data file, each program command for programming the at least one of the k pages.

3. The method of claim 2, wherein the step of programming includes sequentially providing program commands to each of the z Flash memory devices for programming the k−(m*(j*i)) pages, each program command for programming the at least one of the k pages.

4. The method of claim 1, wherein the at least two of the plurality of Flash memory devices are serially connected to each other.

5. The method of claim 4, wherein a first Flash memory device of the at least two of the plurality of Flash memory devices executes a first programming operation in response to a first command, and a second Flash memory device of the at least two of the plurality of Flash memory devices initiates a second programming operation in response to a second command while the first Flash memory device is executing the first operation.

6. The method of claim 5, wherein the second command is passed to the second Flash memory device through the first Flash memory device before the second Flash memory device initiates the second programming operation.

* * * * *